(12) United States Patent
Chuang et al.

(10) Patent No.: US 9,142,743 B2
(45) Date of Patent: Sep. 22, 2015

(54) HIGH TEMPERATURE GOLD-FREE WAFER BONDING FOR LIGHT EMITTING DIODES

(75) Inventors: Chih-Wei Chuang, Albany, CA (US);
Chao-Kun Lin, San Jose, CA (US);
Long Yang, Union City, CA (US);
Norihito Hamaguchi, Morgan Hill, CA (US)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 788 days.

(21) Appl. No.: 13/196,839

(22) Filed: Aug. 2, 2011

(65) Prior Publication Data
US 2013/0032845 A1    Feb. 7, 2013

(51) Int. Cl.
*H01L 33/36* (2010.01)
*H01L 33/62* (2010.01)
(Continued)

(52) U.S. Cl.
CPC ............. *H01L 33/62* (2013.01); *H01L 33/0079* (2013.01); *H01L 24/05* (2013.01); *H01L 24/29* (2013.01); *H01L 24/32* (2013.01); *H01L 24/48* (2013.01); *H01L 24/73* (2013.01); *H01L 24/83* (2013.01); *H01L 33/405* (2013.01); *H01L 2224/05624* (2013.01); *H01L 2224/2929* (2013.01); *H01L 2224/29118* (2013.01); *H01L 2224/29339* (2013.01);
(Continued)

(58) Field of Classification Search
CPC .......................................... H01L 33/02–33/346
USPC .................................................... 257/98–100
See application file for complete search history.

(56) References Cited

U.S. PATENT DOCUMENTS

| 5,262,347 A | 11/1993 | Sands |
|---|---|---|
| 5,306,662 A | 4/1994 | Nakamura et al. |

(Continued)

FOREIGN PATENT DOCUMENTS

| EP | 0881671 A2 | 2/1998 |
|---|---|---|
| JP | 4267376 A | 9/1992 |

(Continued)

OTHER PUBLICATIONS

International Search Report and Written Opinion by the Korean Intellectual Property Office (KIPO) as international searching authority (ISA) in the related international application PCT/US12/041656 dated Dec. 26, 2012 (10 pages).

(Continued)

*Primary Examiner* — Matthew W Such
*Assistant Examiner* — Ali Naraghi
(74) *Attorney, Agent, or Firm* — Hogan Lovells US LLP

(57) ABSTRACT

A vertical GaN-based LED is made by growing an epitaxial LED structure on a silicon wafer. A silver layer is added and annealed to withstand >450° C. temperatures. A barrier layer (e.g., Ni/Ti) is provided that is effective for five minutes at >450° C. at preventing bond metal from diffusing into the silver. The resulting device wafer structure is then wafer bonded to a carrier wafer structure using a high temperature bond metal (e.g., AlGe) that melts at >380° C. After wafer bonding, the silicon is removed, gold-free electrodes (e.g., Al) are added, and the structure is singulated. High temperature solder (e.g., ZnAl) that is compatible with the electrode metal is used for die attach. Die attach occurs at >380° C. for ten seconds without melting the bond metal or otherwise damaging the device. The entire LED contains no gold, and consequently is manufacturable in a high-volume gold-free semiconductor fabrication facility.

25 Claims, 10 Drawing Sheets

SIMPLIFIED CROSS-SECTIONAL SIDE VIEW OF THE WHITE LED ASSEMBLY WITH ONE LED DEVICE (NOT TO SCALE)

(51) Int. Cl.
*H01L 33/00* (2010.01)
*H01L 33/40* (2010.01)
*H01L 23/00* (2006.01)

(52) U.S. Cl.
CPC ............ *H01L 2224/32225* (2013.01); *H01L 2224/48227* (2013.01); *H01L 2224/73265* (2013.01); *H01L 2224/83192* (2013.01); *H01L 2224/83801* (2013.01); *H01L 2924/0132* (2013.01); *H01L 2924/1033* (2013.01); *H01L 2924/10253* (2013.01); *H01L 2924/12041* (2013.01); *H01L 2933/0066* (2013.01)

(56) References Cited

U.S. PATENT DOCUMENTS

| | | |
|---|---|---|
| 5,376,580 A | 12/1994 | Kish et al. |
| 5,408,120 A | 4/1995 | Manabe et al. |
| 5,432,808 A | 7/1995 | Hatano et al. ............. 372/45.01 |
| 5,468,678 A | 11/1995 | Nakamura et al. |
| 5,563,422 A | 10/1996 | Nakamura et al. |
| 5,578,839 A | 11/1996 | Nakamura et al. |
| 5,734,182 A | 3/1998 | Nakamura et al. |
| 5,747,832 A | 5/1998 | Nakamura et al. |
| 5,753,939 A | 5/1998 | Sassa et al. |
| 5,766,783 A | 6/1998 | Utsumi et al. ............. 428/698 |
| 5,777,350 A | 7/1998 | Nakamura et al. |
| 5,959,307 A | 9/1999 | Nakamura et al. |
| 5,959,401 A | 9/1999 | Asami et al. |
| 6,005,258 A | 12/1999 | Manabe et al. |
| 6,040,588 A | 3/2000 | Koide et al. |
| RE36,747 E | 6/2000 | Manabe et al. |
| 6,071,795 A | 6/2000 | Cheung et al. |
| 6,114,188 A | 9/2000 | Oliver et al. |
| 6,121,635 A | 9/2000 | Watanabe et al. ............. 257/91 |
| 6,215,133 B1 | 4/2001 | Nakamura et al. |
| 6,242,764 B1 | 6/2001 | Ohba et al. ............. 257/190 |
| 6,258,699 B1 | 7/2001 | Chang et al. |
| 6,265,726 B1 | 7/2001 | Manabe et al. |
| 6,287,882 B1 | 9/2001 | Chang et al. |
| 6,319,778 B1 | 11/2001 | Chen et al. |
| 6,326,236 B1 | 12/2001 | Koide et al. |
| 6,335,263 B1 | 1/2002 | Cheung et al. |
| 6,420,733 B2 | 7/2002 | Koide et al. |
| 6,423,561 B1 | 7/2002 | Chino et al. |
| 6,541,293 B2 | 4/2003 | Koide et al. |
| 6,610,995 B2 | 8/2003 | Nakamura et al. |
| 6,617,060 B2 | 9/2003 | Weeks, Jr. et al. ............. 428/698 |
| 6,657,236 B1 | 12/2003 | Thibeault et al. |
| 6,800,500 B2 | 10/2004 | Coman et al. |
| 6,812,067 B2 | 11/2004 | Chen et al. |
| 6,838,693 B2 | 1/2005 | Kozaki |
| 6,849,881 B1 | 2/2005 | Harle et al. |
| 6,891,197 B2 | 5/2005 | Bhat et al. |
| 6,906,352 B2 | 6/2005 | Edmond et al. |
| 6,916,676 B2 | 7/2005 | Sano et al. |
| 6,951,695 B2 | 10/2005 | Xu et al. |
| 6,977,395 B2 | 12/2005 | Yamada et al. |
| 7,026,653 B2 | 4/2006 | Sun |
| 7,106,090 B2 | 9/2006 | Harle et al. |
| 7,115,908 B2 | 10/2006 | Watanabe et al. |
| 7,138,286 B2 | 11/2006 | Manabe et al. |
| 7,193,246 B1 | 3/2007 | Tanizawa et al. |
| 7,247,985 B2 | 7/2007 | Kaneko et al. ............. 313/506 |
| 7,262,436 B2 | 8/2007 | Kondoh et al. |
| 7,312,474 B2 | 12/2007 | Emerson et al. |
| 7,335,920 B2 | 2/2008 | Denbaars et al. |
| 7,345,297 B2 | 3/2008 | Yamazoe et al. |
| 7,348,602 B2 | 3/2008 | Tanizawa |
| 7,402,838 B2 | 7/2008 | Tanizawa et al. |
| 7,442,966 B2 | 10/2008 | Bader et al. |
| 7,446,345 B2 | 11/2008 | Emerson et al. |
| 7,491,565 B2 | 2/2009 | Coman et al. |
| 7,547,908 B2 | 6/2009 | Grillot et al. |
| 7,547,925 B2 | 6/2009 | Wong et al. ............. 257/103 |
| 7,611,917 B2 | 11/2009 | Emerson et al. |
| 7,691,651 B2 | 4/2010 | Park ............. 438/22 |
| 7,709,851 B2 | 5/2010 | Bader et al. |
| 7,737,459 B2 | 6/2010 | Edmond et al. |
| 7,754,514 B2 | 7/2010 | Yajima et al. |
| 7,791,061 B2 | 9/2010 | Edmond et al. |
| 7,791,101 B2 | 9/2010 | Bergmann et al. |
| 7,795,623 B2 | 9/2010 | Emerson et al. |
| 7,813,400 B2 | 10/2010 | Denbaars et al. ............. 372/45.011 |
| 7,910,945 B2 | 3/2011 | Donofrio et al. |
| 7,939,844 B2 | 5/2011 | Hahn et al. |
| 7,947,994 B2 | 5/2011 | Tanizawa et al. |
| 7,952,112 B2* | 5/2011 | Wall, Jr. ............. 257/99 |
| 7,968,865 B2 | 6/2011 | LaRoche et al. ............. 257/11 |
| 8,021,904 B2 | 9/2011 | Chitnis |
| 8,030,665 B2 | 10/2011 | Nagahama et al. |
| 8,110,451 B2 | 2/2012 | Akaike et al. ............. 438/143 |
| 8,642,992 B2* | 2/2014 | Miki ............. 257/13 |
| 2001/0042866 A1 | 11/2001 | Coman et al. |
| 2003/0178642 A1 | 9/2003 | Tanaka et al. ............. 257/200 |
| 2004/0104395 A1 | 6/2004 | Hagimoto et al. ............. 257/79 |
| 2005/0051783 A1 | 3/2005 | Song et al. |
| 2005/0212006 A1* | 9/2005 | Kwak et al. ............. 257/99 |
| 2007/0051968 A1 | 3/2007 | Yamamoto et al. |
| 2007/0210304 A1 | 9/2007 | Komiyama et al. ............. 257/40 |
| 2008/0135859 A1* | 6/2008 | Cho et al. ............. 257/94 |
| 2009/0261374 A1 | 10/2009 | Hayashi ............. 257/99 |
| 2010/0148150 A1 | 6/2010 | Miki |
| 2010/0203659 A1 | 8/2010 | Akaike et al. ............. 438/29 |
| 2011/0003470 A1* | 1/2011 | Burgess et al. ............. 438/614 |
| 2011/0073881 A1* | 3/2011 | Chakraborty ............. 257/88 |
| 2011/0127491 A1 | 6/2011 | Jung et al. |
| 2011/0220941 A1* | 9/2011 | Cho ............. 257/98 |
| 2012/0104446 A1 | 5/2012 | Akaike et al. ............. 257/98 |

FOREIGN PATENT DOCUMENTS

| | | |
|---|---|---|
| JP | 2626431 | 5/1994 |
| JP | 2681733 | 5/1994 |
| JP | 2917742 | 6/1994 |
| JP | 2827794 | 8/1994 |
| JP | 2778405 | 9/1994 |
| JP | 2803741 | 9/1994 |
| JP | 2785254 | 1/1995 |
| JP | 2735057 | 3/1996 |
| JP | 2956489 | 3/1996 |
| JP | 8264894 A | 10/1996 |
| JP | 2666237 | 12/1996 |
| JP | 2890396 | 12/1996 |
| JP | 3250438 | 12/1996 |
| JP | 3135041 | 6/1997 |
| JP | 3209096 | 12/1997 |
| JP | 3506874 | 1/1998 |
| JP | 3654738 | 2/1998 |
| JP | 3795624 | 2/1998 |
| JP | 3304787 | 5/1998 |
| JP | 3344257 | 8/1998 |
| JP | 3223832 | 9/1998 |
| JP | 3374737 | 12/1998 |
| JP | 11040847 A | 2/1999 |
| JP | 3314666 | 3/1999 |
| JP | 4118370 | 7/1999 |
| JP | 4118371 | 7/1999 |
| JP | 3548442 | 8/1999 |
| JP | 3622562 | 11/1999 |
| JP | 3424629 | 8/2000 |
| JP | 4860024 | 8/2000 |
| JP | 3063756 | 9/2000 |
| JP | 4629178 | 9/2000 |
| JP | 3063757 | 10/2000 |
| JP | 3511970 | 10/2000 |
| JP | 3748011 B2 | 12/2000 |
| JP | 3551101 | 5/2001 |
| JP | 3427265 | 6/2001 |
| JP | 3646649 | 10/2001 |
| JP | 3780887 | 5/2002 |
| JP | 3890930 | 5/2002 |
| JP | 3786114 | 4/2004 |
| JP | 4904261 | 6/2004 |

(56) References Cited

FOREIGN PATENT DOCUMENTS

| JP | 2005-079298 | | 3/2005 |
|---|---|---|---|
| JP | 200586210 | A | 3/2005 |
| JP | 2005183650 | A | 7/2005 |
| JP | 2008147672 | A | 6/2008 |
| JP | 2010098281 | A | 4/2010 |
| JP | 2010-186829 | | 8/2010 |
| JP | 2010171368 | A | 8/2010 |
| JP | 2011119734 | A | 6/2011 |
| JP | 2011-146575 | | 7/2011 |
| JP | 2011146575 | A | 7/2011 |

OTHER PUBLICATIONS

W.S. Wong, "Integration of GaN Thin Films with Dissimilar Substrate Materials by Wafer Bonding and Laser Lift-off," Copyright 1999, pp. 1-133.

Mike Cooke, "High-Brightness Nitride LEDs on Silicon Through Wafer Bonding", Jun. 4, 2011. (URL: "http://www.semiconductor-today.com/news_items/2011/JUNE/KOREAPHOTONICS_040611.html") (4 pages).

Dadgar et al., "Epitaxy of GaN on silicon-impact of symmetry and surface reconstruction," New Journal of Physics, vol. 9, No. 389 (2007); IOP Publishing Ltd., http://iopscience.iop.org/1367-2630/9/10/389 (10 pages).

Bae et al., "Surface Investigation of a Cubic AlN Buffer Layer and GaN Grown on Si(111) and Si(100) as Revealed by Atomic Force Microscopy," Journal of the Korean Physical Society, vol. 49, No. 3, Sep. 2006, pp. 1092-1096 (5 pages).

Keyan et al., "Structural analysis of metalorganic chemical vapor deposited AlN nucleation layers on Si(111)," Singapore-MIT Alliance, Jan. 2004, citable URI: http://hdl.handle.net/1721.1/3841 (4 pages).

Korean Office Action dated Oct. 31, 2014, corresponding to Korean Application No. 10-2013-7023781. English Translation.

Japanese Office Action dated Dec. 26, 2014 corresponding to Japanese Application No. 2014515889. English Translation.

Office Action dated Oct. 27, 2014 corresponding to Taiwan Patent Application No. 101120374.

N. Quitoriano et al., "Implications for Transient-Liquid-Phase Wafer Bonding," Journal of Electronic Materials, vol. 30, No. 11, Nov. 2001.

W. Wong et al., "The Integration of GaN Thin Films with Dissimilar Substrate Materials by Wafer Bonding and Laser Lift-off," Compound Semiconductor, vol. 5, No. 9, Nov./Dec. 1999.

W.S. Wong et al., "InxGa1-xN light emitting diodes on Si substrates fabricated by Pd—In metal bonding and laser liftoff," Applied Physics Letters, vol. 77, No. 18, Oct. 30, 2000.

W.S. Wong et al., "Fabrication of thin-film InGaN light-emitting diode membranes by laser lift-off," Applied Physics Letters, vol. 75, No. 10, Sep. 6, 1999.

W.S. Wong et al., "Structural and optical quality of GaN/metal/Si heterostructures fabricated by excimer laser lift-off," Applied Physics Letters, vol. 75, No. 13, Sep. 27, 1999.

W.S. Wong et al., "Selective UV-Laser Processing for Lift-Off of GaN Thin Films from Sapphire Substrates," Electrochemical Society Proceedings, vol. 98-2, Published 1998.

W.S. Wong, "Intergration of GaN Thin Films with Dissimilar Substrate Materials by Wafer Bonding and Laser Lift-off," Dissertation in partial satisfaction of the requirements for the degree of, Doctor of Philosophy in Engineering—Materials Science and Mineral Engineering, in the Graduate Division of the University of California, Berkeley, Fall 1999.

W.S. Wong, "Intergration of GaN Thin Films with Dissimilar Substrate Materials by Pd—In Metal Bonding and Laser Lift-off," Journal of Electronic Materials, vol. 28, No. 12, Dec. 1999.

W.S. Wong, "Integration of InGaN-based Optoelectronics with Dissimilar Substrates by Wafer Bonding and Laser Lift-off," Materials Research Society, vol. 681E Copyright 2001.

* cited by examiner

WAFER BONDING

REMOVE SILICON
SUBSTRATE

BOND LED DEVICE TO SUBSTRATE

CROSS-SECTIONAL SIDE VIEW
OF WHITE LED ASSEMBLY

TOP-DOWN VIEW OF WHITE LED
ASSEMBLY

TOP-DOWN VIEW OF BLUE LED
DEVICE 104

SIMPLIFIED CROSS-SECTIONAL SIDE VIEW OF THE
WHITE LED ASSEMBLY WITH ONE LED DEVICE
(NOT TO SCALE)

| NUMBER | NAME OF LAYER OR STRUCTURE | COMPOSITION AND STRUCTURE | THICKNESS |
|---|---|---|---|
| 1 | SUBSTRATE | SILICON | |
| 2 | BUFFER LAYER | ZnS 50nm (on top of substrate)<br>AlN 250nm (on top of ZnS)<br>AlGaN 50nm (on top of AlN) | 350nm |
| 3 | TEMPLATE LAYER | u-GaN<br>UNDOPED | 1000nm |
| 4 | LOW RESISTANCE LAYER (LRL) | n-GaN/AlGaN PERIODS<br>5 PERIODS (SUPERLATTICE)<br>n-GaN 100nm (UPPER SUBLAYER)<br>$Al_{0.3}Ga_{0.7}N$ (UNDOPED) 25nm (LOWER SUBLAYER)<br>EACH THINNER AlGaN SUBLAYER IS "STRAINED TO" A THICKER LAYER OF GaN<br>SHEET RESISTANCE IS LOWER THAN THE SHEET RESISTANCE OF THE N-TYPE LAYER<br>n-GaN DOPANT = 1E18 ATOMS/CCM SILICON | 625nm |
| 5 | N-TYPE LAYER | n-GaN/n-AlGaN:Si or AlN PERIODS<br>(TOTAL THICKNESS >2000nm)<br>5 PERIODS<br>n-GaN <1000 nm (e.g., 900nm)<br>n-AlGaN:Si <25nm (e.g., 5nm)<br>ONE n-GaN SUBLAYER IS AT THE TOP OF THE N-TYPE LAYER, AND ANOTHER IS AT THE BOTTOM OF THE N-TYPE LAYER<br>SHEET RESISTANCE OF THE N-TYPE LAYER AT THE LRL/N-TYPE LAYER INTERFACE IS >15 OHMS/SQUARE | ~5000nm |
| 6 | STRAIN RELEASE LAYER | n-GaN DOPANT = 5E18 ATOMS/CCM SILICON<br>$In_xGa_{1-x}N/In_yGa_{1-y}N$ PERIODS<br>30 PERIODS<br>$In_xGa_{1-x}N$ 1-30nm, 0<x<0.12<br>$In_yGa_{1-y}N$ 1-30nm, 0<y<0.12 | 120nm |
| 7 | ACTIVE LAYER | InGaN/GaN PERIODS<br>10 PERIODS (MQW)<br>InGaN 3nm<br>GaN 10nm<br>In = 15%<br>EMITS NON-MONOCHROMATIC 440nm-490nm WAVELENGTH LIGHT | 130nm |

FIG. 8A

| 8 | P-TYPE LAYER | p-GaN<br>DOPANT TYPE = MAGNESIUM<br>DOPANT CONCENTRATION = 1E20 ATOMS/CCM<br>UPPER SURFACE IS SUBSTANTALLY PLANAR -<br>NO CURRENT FOCUSING RIDGE STRUCTURES | 300nm |
|---|---|---|---|
| 9 | CURRENT BLOCKING LAYER | SILICON DIOXIDE | 200nm |
| 10 | HIGHLY REFLECTIVE LAYER | SILVER<br>(ANNEALED AT 400°C) | 200nm |
| 11 | SILVER ENCAPSULATION LAYER | PLATINUM<br>(<200nm PLATINUM IN THE ENTIRE LED DEVICE) | 100nm |
| 12 | HIGH TEMP BARRIER LAYER | NICKEL 1000nm (CLOSEST TO SILVER)<br>TITANIUM 200nm<br>PREVENTS DIFFUSION INTO SILVER<br>FOR ONE MINUTE AT 400°C<br>ALTERNATIVES:<br>Ni/TiN/Ti  1000nm/200nm/200nm<br>Ni/SiN$_x$/Ti  1000nm/200nm/200nm | 1200nm |
| 13 | HIGH TEMP BOND METAL LAYER | ALUMINUM 1000nm (~49%) (DEVICE SIDE)<br>GERMANIUM 50nm (CAP - DEVICE SIDE)<br>GERMANIUM 1000nm (~51%) (CARRIER SIDE)<br>440°C FOR >1 MINUTE | 2050nm |
| 14 | ADHESION AND BARRIER METAL LAYER | TITANIUM | 200nm |
| 15 | CONDUCTIVE CARRIER | CONDUCTIVE SILICON SUBSTRATE | 150,000nm |
| 16 | P-ELECTRODE METAL | ALUMINUM (NO GOLD) | 220nm |
| 17 | N-ELECTRODE METAL | ALUMINUM (NO GOLD) | 340nm |
| 18 | HIGH TEMP DIE ATTACH SOLDER LAYER | ZnAl SOLDER<br>(WETS ALUMINUM WELL)<br>400°C FOR 10 SECONDS<br>ALTERNATIVES:  AlSi, AuSi, AuGe, AuSn | ~3000nm |
| 19 | PCB | METAL CORE PCB (ALUMINUM) | |
| 20 | RETAINING RING | SILICONE<br>0.5-300mm HIGH, 0.2-1.5mm WIDE<br>CUT AND SHAPED | |
| 21 | PHOSPHOR | | |

FIG. 8B

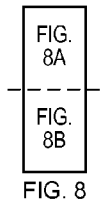

FIG. 8

KEY TO FIG. 8

FLIP THE RESULTING WAFER BONDED STRUCTURE

REMOVE SILICON SUBSTRATE, BUFFER AND TEMPLATE

HIGH TEMP DIE ATTACH

WIRE BOND

HIGH TEMPERATURE GOLD-FREE WAFER BONDING FOR LIGHT EMITTING DIODES

TECHNICAL FIELD

The present disclosure relates generally to GaN-based blue LEDs manufactured on silicon substrates and related methods and structures.

BACKGROUND INFORMATION

A Light Emitting Diode (LED) is a solid state device that converts electrical energy to light. Light is emitted from an active layer of semiconductor materials sandwiched between oppositely doped layers when a voltage is applied across the doped layers. One type of LED device, referred to here as a blue LED device, involves gallium nitride (GaN) layers.

FIGS. 1-3 (Prior Art) illustrate a prior art process used to make such a prior art blue LED device. A buffer layer 50 is grown on a silicon substrate 52, and a template layer 51 is grown on the buffer layer. An epitaxial LED structure 53 including an n-type layer 54, an active layer 55, and a p-type layer 56 is grown on the template layer. A silver mirror layer 57 is formed over the epitaxial LED structure. A silver encapsulation layer 58 is formed over the silver layer 57. A barrier layer 59 is formed over the encapsulation layer 58. The resulting device wafer structure 60 is then wafer bonded to a carrier wafer structure 61 as illustrated in FIG. 1 to form a wafer bonded structure 66.

Carrier wafer structure 61 involves a conductive carrier 63, a sublayer 64 of gold, and a sublayer 65 of gold/tin as illustrated. Prior to wafer bonding, there is also a sublayer 62 of gold on the top of the device wafer structure 60. The gold sublayers and the gold/tin sublayer are together referred to as a wafer bonding layer.

Wafer bonding involves pressing the two wafer structures 60 and 61 together and raising the temperature such that the gold/tin sublayer 65 melts. After cooling, when the gold/tin sublayer resolidifies, the two wafer structures are bonded together to form the wafer bonded structure 66. If during the wafer bonding process any of gold or tin were to diffuse into the silver layer 57, then the reflectivity of the silver might be decreased and/or the resistance of the contact at the silver-to-p-layer interface might be increased. Barrier layer 59 is provided to prevent such unwanted diffusion. FIG. 1 shows the multi-layer structure of the barrier layer 59 in the prior art example of FIGS. 1-3. Barrier layer 59 includes multiple periods. Each period includes a platinum sublayer and a titanium-tungsten sublayer.

Silicon is opaque to the blue light emitted by the active layer. Silicon substrate 52 and buffer layer 50 are therefore removed from the bonded wafer structure, thereby forming the wafer bonded structure 66 illustrated in FIG. 2. The upper surface of structure 66 is then roughened, and an n-type metal electrode 67 is added to the top of the structure, and a p-type metal electrode 68 is added to the bottom of the structure. The wafer bonded structure with its electrodes is then singulated to form individual LED devices.

FIG. 3 (Prior Art) shows one of these LED devices as part of a white LED assembly 74. The LED device is attached to a first portion of metal 69 of a metal core Printed Circuit Board (PCB) 70 or other package in what is commonly referred to as "die attach". The LED device cannot be heated to too high a temperature during the die attach process or the gold/tin wafer bond material will melt and the LED device will come apart. Silver epoxy 71, that is applied and cures in a temperature environment that does not exceed 150° C., is therefore commonly used. The n-electrode 67 is typically connected via a wire bond 72 to a second portion of metal 73 of the metal core PCB 70 as illustrated in FIG. 3.

SUMMARY

A vertical GaN-based LED is made by growing an epitaxial LED structure on a substrate. In one example, the substrate is a conductive silicon wafer. The epitaxial LED structure includes an n-type layer, a p-type layer, and an active layer disposed between the n-type layer and the p-type layer. The GaN-based LED is a blue LED, and the active layer comprises an amount of indium. A silver layer is formed onto the p-type layer, thereby forming an ohmic contact to the epitaxial LED structure. The silver layer is annealed so that the silver to p-GaN interface will be able to withstand >450° C. temperatures. An encapsulation layer is added, and a high temperature barrier layer is provided over the encapsulation layer. The high temperature barrier layer is effective for five minutes at 450° C. at preventing bond metal from diffusing into the silver layer. In one example, the barrier layer includes a 1000 nm thick nickel sublayer on the encapsulation layer, and a 200 nm thick titanium sublayer on the nickel sublayer. In another example, the barrier layer includes a 1000 nm thick nickel sublayer on the encapsulation layer, a 200 nm thick titanium-nitride sublayer on the nickel sublayer, and a 200 nm thick titanium sublayer on the titanium-nitride sublayer. In another example, the barrier layer includes a 1000 nm thick nickel sublayer on the encapsulation layer, a 200 nm thick silicon-nitride sublayer on the nickel sublayer, and a 200 nm thick titanium sublayer on the silicon-nitride sublayer.

The resulting device wafer structure is then wafer bonded to a carrier wafer structure using a high temperature bond metal that melts at >380° C. In one example, the bond metal is aluminum-germanium (Te=420° C.) and the wafer bonding occurs at 440° C. for five minutes. The bond metal layer has an AlGe interface melting temperature of 420° C. A layer of aluminum approximately 1000 nm thick is provided on the device wafer structure, and a 50 nm thick cap of germanium is provided on the aluminum. A layer of germanium 1000 nm thick is provided on the carrier device wafer structure. During wafer bonding, bond metal on the device wafer structure and the bond metal on the carrier wafer structure melt and fuse together to form a wafer bonded structure. Despite the high >380° C. wafer bonding temperature for the prolonged period (more than one minute), the reflectivity and ohmic contact qualities of the silver layer are not degraded.

In another example, the bond metal involves aluminum-silicon (Te=580° C.). In other examples, where the bond metal temperature is less than 380° C. and where the LED device is not gold-free, the bond metal may be gold-silicon (Te=370° C.) or gold-germanium (Te=360° C.)

After high temperature wafer bonding, the original substrate is removed from the wafer bonded structure such as, for example, by grinding, lapping, Chemical Mechanical Polishing (CMP) and Reactive Ion Etching (RIE). The structure resulting is then etched to form streets down to the encapsulation layer between LED mesa structures. The exposed tops of the mesa structures are roughened. Gold-free electrodes are then added. In one example, the gold-free electrodes are electrodes of substantially pure aluminum. The resulting wafer structure is then singulated into individual vertical LED devices. High temperature solder (e.g., ZnAl) that is compatible with the particular electrode metal used is then used for die attach. Die attach occurs at 380° C. or above (for example, 400° C. for ten seconds) without melting the bond metal, or damaging the reflectivity or ohmic contact properties of the silver to p-GaN interface, or otherwise damaging the LED device. In some example, a retaining ring is applied, and an amount of phosphor is provided in the ring and is cured. The resulting overall entire LED assembly contains no gold. Parts of the manufacturing process can therefore be carried out in a high-volume gold-free semiconductor fabrication facility. Eliminating gold from the LED assembly further reduces manufacturing costs as compared to conventional LED assemblies that include substantial amounts of gold.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIGS. 8A and 8B together form FIG. 8. FIG. 8 is a table that sets forth details about each step of a method of manufacturing the white LED assembly of FIG. 4.

FIG. 9 is a diagram of a high temperature wafer bonding step in the method of manufacturing the white LED assembly of FIG. 4.

FIG. 10 is a graph that illustrates a temperature cycle used in the high temperature wafer bonding step of FIG. 9.

FIG. 11 is a diagram of a step of flipping the wafer bonded structure that results from the wafer bonding step of FIG. 9.

FIG. 12 is a diagram of a step of removing the silicon substrate from the wafer bonded structure of FIG. 11.

FIG. 13 is a diagram of a step of roughening a surface of the wafer bonded structure that results from the removing step of FIG. 12.

FIG. 14 is a diagram of a step of adding electrodes to the structure that results from the roughening step of FIG. 13.

FIG. 15 is a diagram of a high temperature die attach step in which the completed LED device is soldered to a metal surface of an aluminum core PCB.

FIG. 16 is a diagram of a step of wire bonding a p-electrode of the LED device to a metal portion of the metal core PCB.

DETAILED DESCRIPTION

Reference will now be made in detail to some embodiments of the invention, examples of which are illustrated in the accompanying drawings. In the description and claims below, when a first layer is referred to as being disposed "over" a second layer, it is to be understood that the first layer can be directly on the second layer, or an intervening layer or layers may be present between the first and second layers. The terms such as "over", "under", "upper", "lower", "top", "bottom", "upward", "downward", "vertically", and "laterally" are used herein to describe relative orientations between different parts of the blue LED device being described, and it is to be understood that the overall blue LED device being described can actually be oriented in any way in three-dimensional space.

Figure 4:
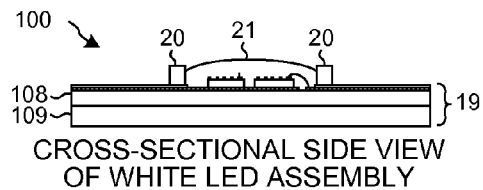
FIG. 4 is a cross-sectional diagram of a white LED assembly in accordance with one novel aspect.
Figure 5:
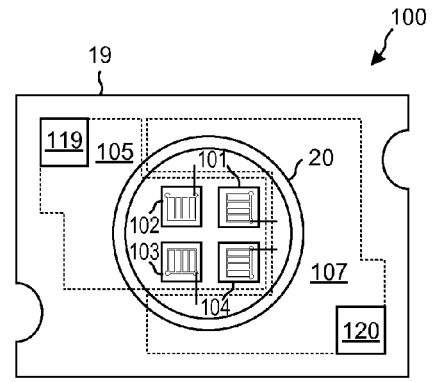
FIG. 5 is a top-down diagram of the white LED assembly of FIG. 4.

FIG. 4 is a cross-sectional side view of a white Light Emitting Diode (LED) assembly 100. FIG. 5 is a top-down diagram of the white LED assembly 100. The white LED assembly 100 includes four vertical blue LED devices 101-104 that are mounted to a metal core Printed Circuit Board (PCB) 19. From the top-down perspective, the four vertical blue LED devices 101-104 are surrounded by a retaining ring 20. The retaining ring 20 retains an amount of phosphor 21 that covers the blue LED devices 101-104. A portion of a first metal structure 105 is exposed through a first opening in a soldermask layer 106. Anode electrodes of the blue LED devices 101-104 are surface mounted via amounts of solder 18 to the first metal structure 105 in this first opening. The first opening in the soldermask layer 106 also exposes a portion of a second metal structure 107. Upwardly facing cathode electrodes of the blue LED devices 101-104 are wirebonded to the exposed portion of the second metal structure 107. A first pad 119 is formed by another opening in soldermask layer 106. A second pad 120 is formed by yet another opening in soldermask layer 106. As illustrated in the cross-sectional view of FIG. 6, the first and second metal structures 105 and 107 are portions of a metal layer that is disposed on a dielectric layer 108. Dielectric layer 108 is a 35 um to 250 um thick layer of an epoxy material containing inorganic fillers like $Al_2O_3$. This dielectric layer 108 insulates the first and second metal structures 105 and 107 from an aluminum or copper base portion 109 of the metal core PCB 19.

Figure 7:
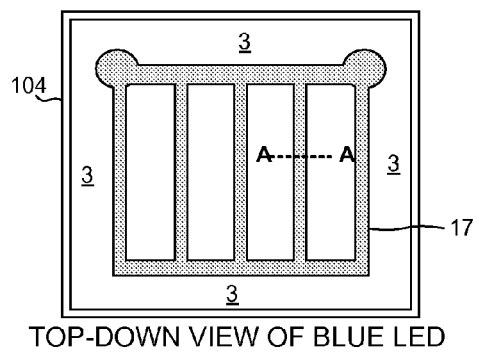
FIG. 7 is a top-down diagram of the LED device within the LED assembly of FIG. 4.
Figure 6:
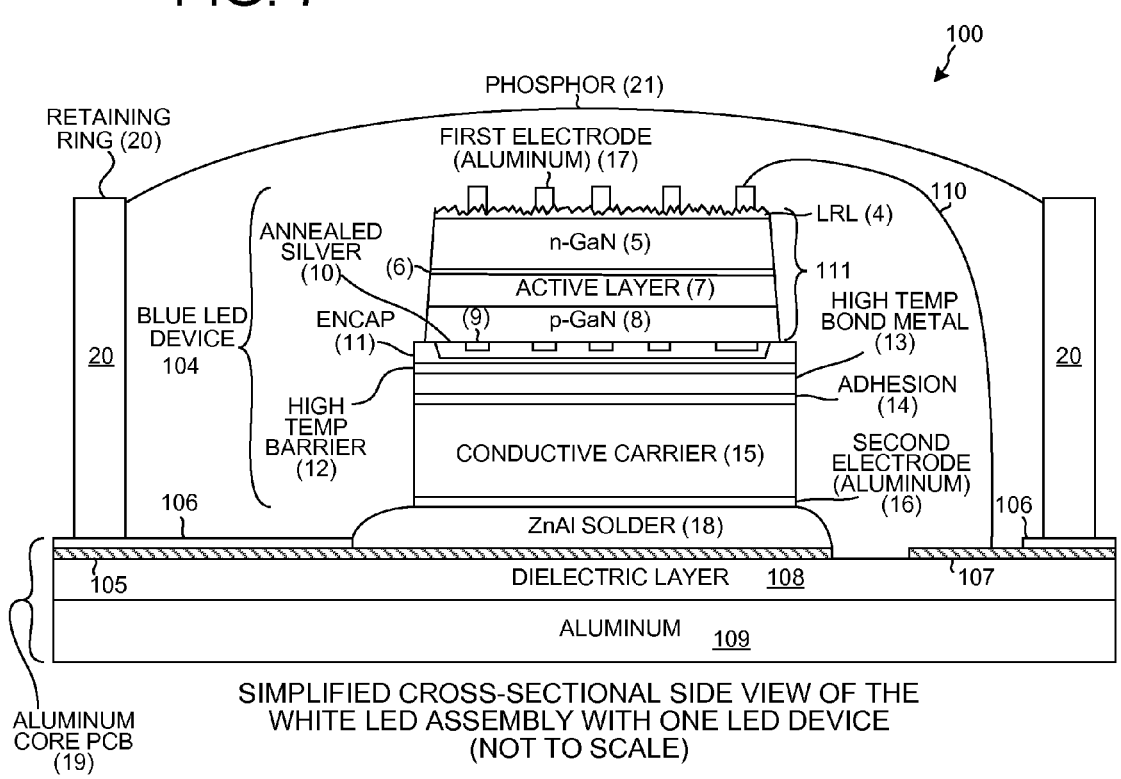
FIG. 6 is an expanded simplified cross-sectional diagram of the white LED assembly of FIG. 4.

FIG. 6 is a simplified cross-sectional side view of the white LED assembly 100. Only one vertical blue LED 104 is illustrated in the diagram. FIG. 7 is a top-down diagram of the vertical blue LED device 104 within the white LED assembly 100 of FIG. 6. The first metal electrode 17 has a grid shape. A vertical LED device is sometimes referred to as a vertically-contacted LED device to distinguish it from a lateral or a laterally-contacted LED device.

Vertical blue LED device 104 within white LED assembly 100 of FIG. 6 includes numerous layers, some of which are illustrated in FIG. 6: a first metal electrode 17, a roughened portion of Low Resistance Layer (LRL) 4, an n-type gallium-nitride layer 5, a strain release layer 6, an active layer 7, a p-type gallium-nitride layer 8, a current blocking layer 9, a silver layer 10, an encapsulation layer 11 for encapsulating the silver layer, a high temperature barrier layer 12, a high temperature wafer bond metal layer 13, an adhesion and barrier layer 14, a conductive carrier 15, and a second metal electrode 16. Reference numeral 110 identifies a wire bond that couples the first metal electrode 17 of the blue LED device 104 to the second metal structure 107. First metal electrode 17 and roughened portion 3 are conductive and function to make electrical contact to the n-type layer 5. Silver layer 10 and all the layers below it are conductive and function to make electrical contact to the p-type layer 8.

In a first novel aspect, the entire white LED assembly 100 includes no gold. Having no gold in the white LED assembly 100 is desirable for at least two reasons.

First, it is desirable to be able to use a high volume silicon foundry to carry out some of the steps in the manufacturing of white LED devices. In one example, the epitaxial LED structure 111 is grown on a silicon substrate by a first commercial entity at a first semiconductor fabrication facility. The resulting device wafer structure is then to be supplied to a second commercial entity that operates a second semiconductor fabrication facility. This second fabrication facility, due to the very high volumes of silicon integrated circuits being processed at the second facility, can perform some of the subsequent processing for an advantageously low cost. At the second facility the silver mirror layer is to be added, the wafer bond metal layers are to be added, the carrier wafer structure is to be wafer bonded to the device wafer structure, the silicon substrate is to be removed, the first and second electrodes are to be added, and the resulting wafer bonded structure is to be singulated into individual LED devices. Thereafter, these singulated individual LED devices are to be supplied to the first or another commercial entity. The first or other commercial entity is then to perform the die attach operation, and to wirebond the n-electrode 17 to metal portion 107 of the metal core PCB, and to add retaining ring 20 and phosphor 21 to make the completed white LED assembly 100.

Gold is, however, a serious impurity that can damage ordinary silicon integrated circuits. The second fabrication facility is a high volume facility for processing such integrated circuits, and the second commercial entity simply will not permit there to be any gold in its semiconductor fabrication facilities. In order to reduce the cost of making the overall white LED assemblies, it is desired to eliminate all gold from the blue LED devices so that economies of scale can be taken advantage of by using the semiconductor fabrication facilities of the second commercial entity.

Figure 1:
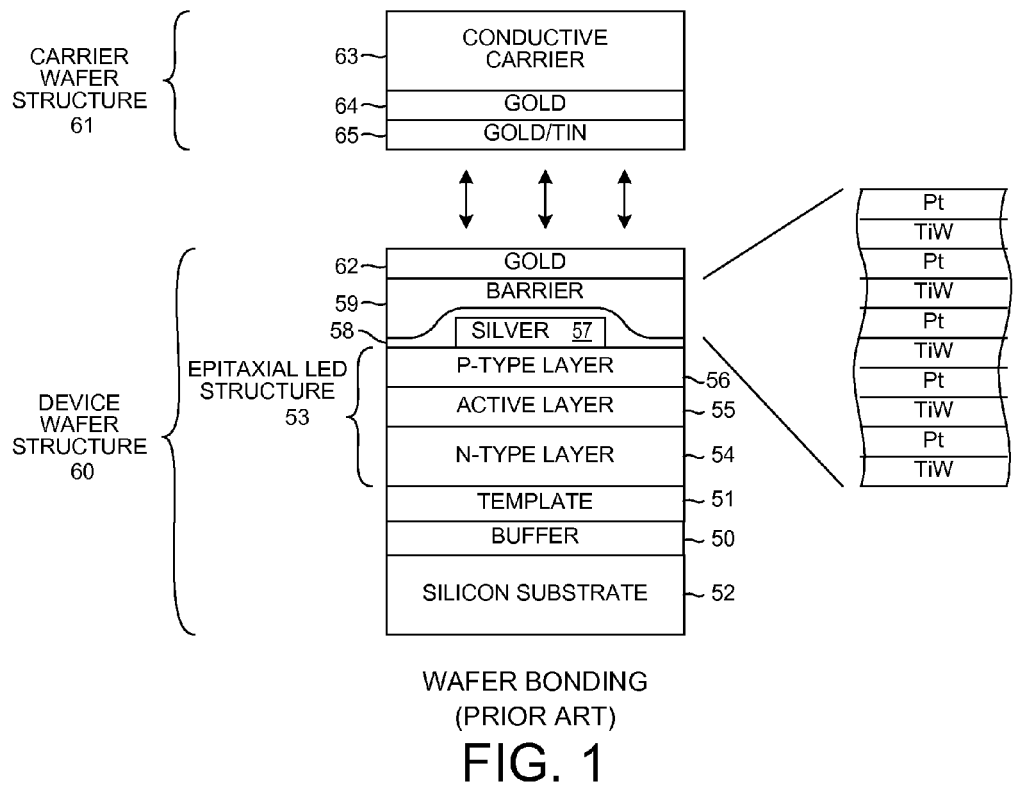
FIG. 1 (Prior Art) is an illustration of a prior art wafer bonding step that is carried out in the manufacture of a prior art blue LED device.
Figure 2:
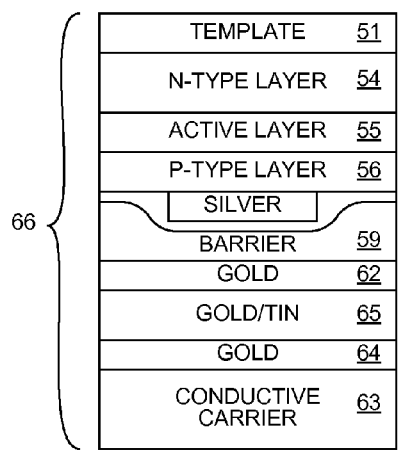
FIG. 2 (Prior Art) is an illustration of the wafer bonded structure that results after the wafer bonding of FIG. 1 has occurred and after a subsequent step of removing the silicon substrate has occurred.
Figure 3:
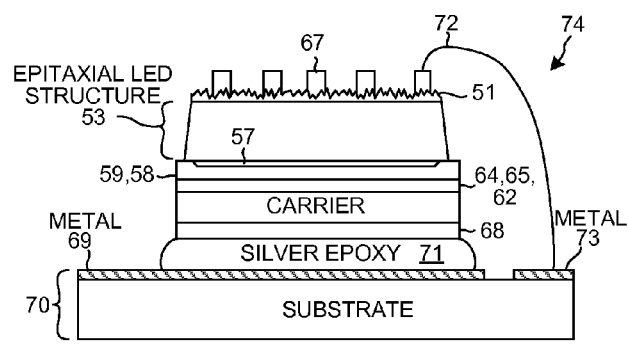
FIG. 3 (Prior Art) is an illustration of the wafer bonded structure of FIG. 2 after electrodes have been added, and after the resulting LED device has been die attached to a metal core PCB.

A second reason not to have any gold in the blue LED structure is that gold is an expensive material. The gold/tin bond metal layer 65 in the prior art of FIGS. 1-3 includes a substantial amount of gold. In addition, the p-electrode 68 in the prior art of FIGS. 1-3 involves 20 nm of nickel covered with 200 nm of gold. It is desirable to be able to reduce the manufacturing cost of the overall blue LED device by replacing this gold with less expensive materials. Accordingly, gold in the p-electrode 68 of the prior art of FIGS. 1-3 is replaced with less expensive aluminum in the novel white LED assembly 100 of FIG. 6. The silver epoxy 71 used in die attach in the prior art LED assembly of FIGS. 1-3 is not a good thermal conductor. It is therefore desired to use a metal solder process to die attach the p-electrode 16 to the underlying metal core PCB 19. The solder conventionally used in die attaching the p-electrode of a LED device to a substrate does not wet aluminum well, and metal layer 16 in the novel structure of FIG. 6 is aluminum. ZnAl solder, however, does wet aluminum well. In a second novel aspect, a ZnAl soldering process is used for die attaching blue LED device 104 to metal portion 105 of the aluminum core PCB 19.

The ZnAl soldering process, however, requires a temperature of at least 380° C. for at least ten seconds to melt the ZnAl solder. If the conventional blue LED device of FIG. 3 were used with this high temperature ZnAl die attach soldering process, then the gold/tin wafer bonding layer 65 would melt and the blue LED device would come apart during die attach. In a third novel aspect, a high temperature wafer bonding process is used in making the blue LED device 104 of FIG. 6. In one example, the high temperature wafer bonding process involves depositing an aluminum layer that is 1000 nm thick on the device wafer structure and covering this aluminum layer with a 50 nm thick capping layer of germanium. In addition, the wafer bonding process involves depositing a germanium layer that is 1000 nm thick on the carrier wafer structure. The carrier wafer structure and the device wafer structure are then pressed together and heated to a temperature of 440° C. for more than one minute (for example, five minutes) until the aluminum and germanium melt and fuse. Due to the use of this high temperature wafer bonding process, the wafer bonded LED device can thereafter withstand die attach at 380° C. for more than ten seconds.

Furthermore, if the barrier layer of the conventional LED device of FIG. 3 were used in the white LED assembly 100 of FIG. 6, then the high temperature AlGe wafer bonding step and the high temperature AlZn die attach step would likely result in diffusion of aluminum and/or germanium from the metal wafer bonding layer up through the barrier layer and into the silver layer. If aluminum and/or germanium were to diffuse through the barrier layer in this way, then the reflectivity of the silver would be decreased and/or the ohmic contact at the silver to p-GaN interface would be degraded. In a fourth novel aspect, the white LED assembly 100 of FIG. 6 employs a high temperature barrier layer 12. This high temperature barrier layer 12 blocks diffusion into the silver layer during the high temperature AlGe wafer bonding process for the five minute duration of the wafer bonding process. Moreover, the barrier layer 12 blocks diffusion into the silver layer during the high temperature ZnAl die attach process employed.

In addition, if the silver of silver layer 10 were simply deposited as in the conventional LED device of FIG. 3, then the high temperature cycles of AlGe wafer bonding process and the ZnAl die attach would result in degradation of the ohmic contact at the silver to p-GaN interface. In a fifth novel aspect, the silver of silver layer 10 is deposited, and then this silver layer is annealed at about 400° C. Annealing the silver layer 10 in this way increases the thermal stability of the silver to p-GaN interface contact such that it can thereafter sustain 450° C. temperatures without substantial degradation.

FIG. 8 is a table that sets forth details about each step of the method of manufacturing the white LED assembly 100. The numbers in the left column of the table are the reference numerals for the various layers of the white LED assembly 100.

Figure 9:
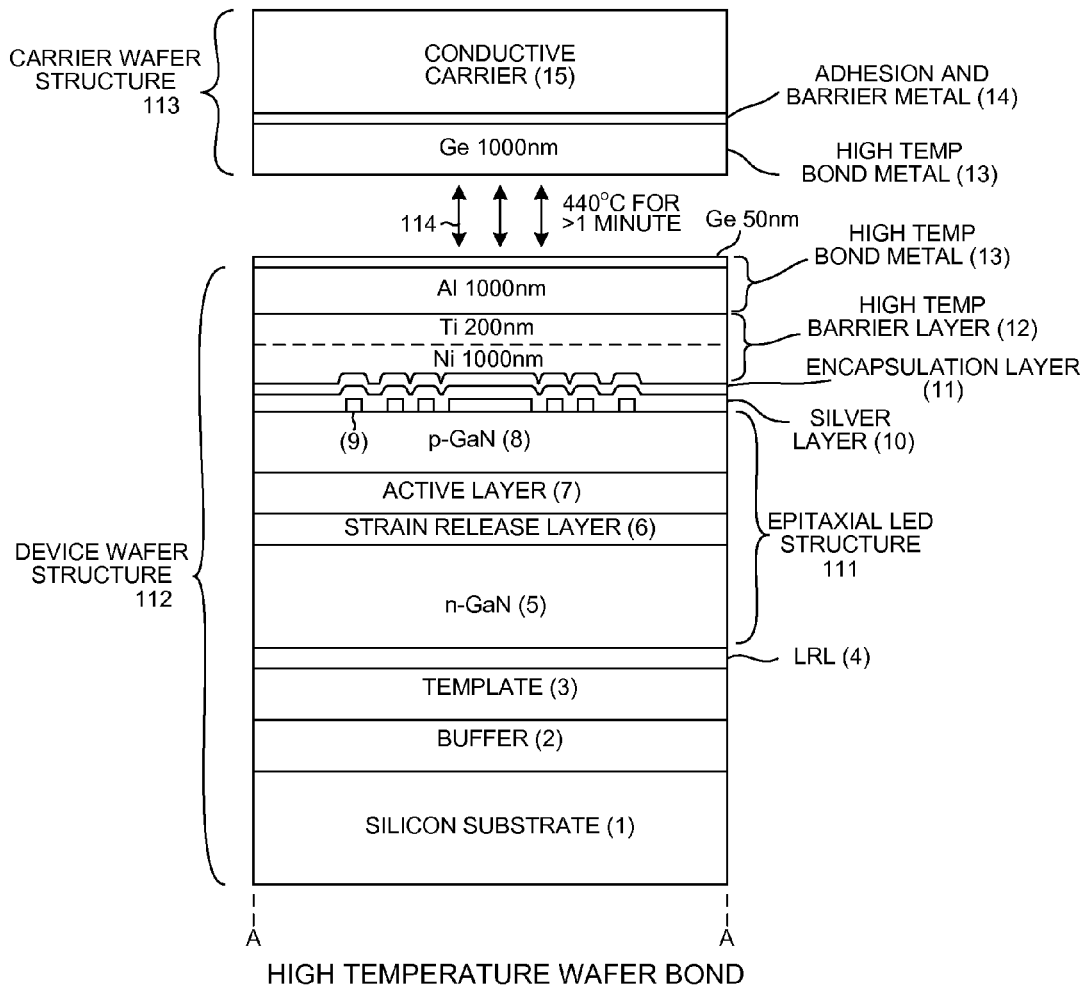
FIGS. 9-16 are a set of diagrams that set forth a gold-free high temperature bond metal process for manufacturing the LED assembly of FIG. 4.

FIGS. 9-16 set forth a gold-free process for making a blue LED using a high temperature wafer bonding process. The diagrams are not to scale, but rather are conceptual diagrams. The view of the cross-sectional diagram of FIG. 9 is taken along sectional line A-A of FIG. 7. Starting with silicon substrate 1, the following layers are grown or deposited in the following order: buffer layer 2, template layer 3, LRL 4, n-type layer 5, strain release layer 6, active layer 7, p-type layer 8, current blocking layer 9, silver layer 10, encapsulation layer 11, the high temperature barrier layer 12, and the aluminum portion of the high temperature wafer bond metal layer 13. The compositions of these various layers are as set forth in the table of FIG. 8. This structure is referred to as the device wafer structure 112.

Starting with a conductive carrier 15, the following layers are deposited: adhesion layer 14, and the germanium portion of the high temperature wafer bond metal layer 13. The compositions of these layers are as set forth in the table of FIG. 8. This structure is referred to as the carrier wafer structure 113.

Figure 10:
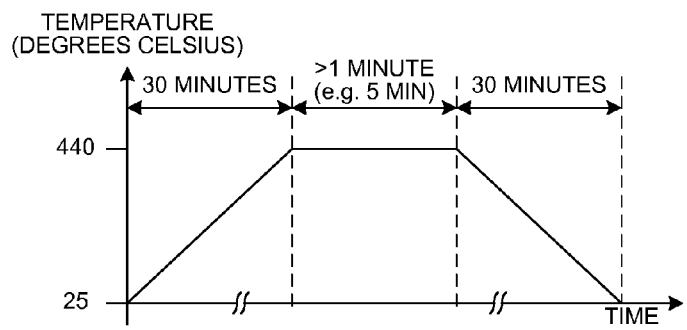

FIG. 10 is a graph showing the temperature cycle of the thermal compression wafer bonding process used. Carrier wafer structure 113 is pressed against device wafer structure 112 with a pressure of approximately fifty pounds per square inch and the pressed together wafers are heated to at least 400° C. In the specific example, the wafers are heated to 440° C. The wafers remain at this elevated temperature for a period of more than one minute to ensure there is a uniform melting temperature all across the wafers. In the specific example, the elevated temperature is maintained for five minutes. The aluminum and germanium layers melt and fuse, thereby wafer bonding the carrier wafer structure 113 to the device wafer structure 112. The bond metal layer 13 contains approximately 49 percent aluminum and approximately 51 percent germanium by weight. This wafer bonding is represented by arrows 114 in FIG. 9.

Figure 11:
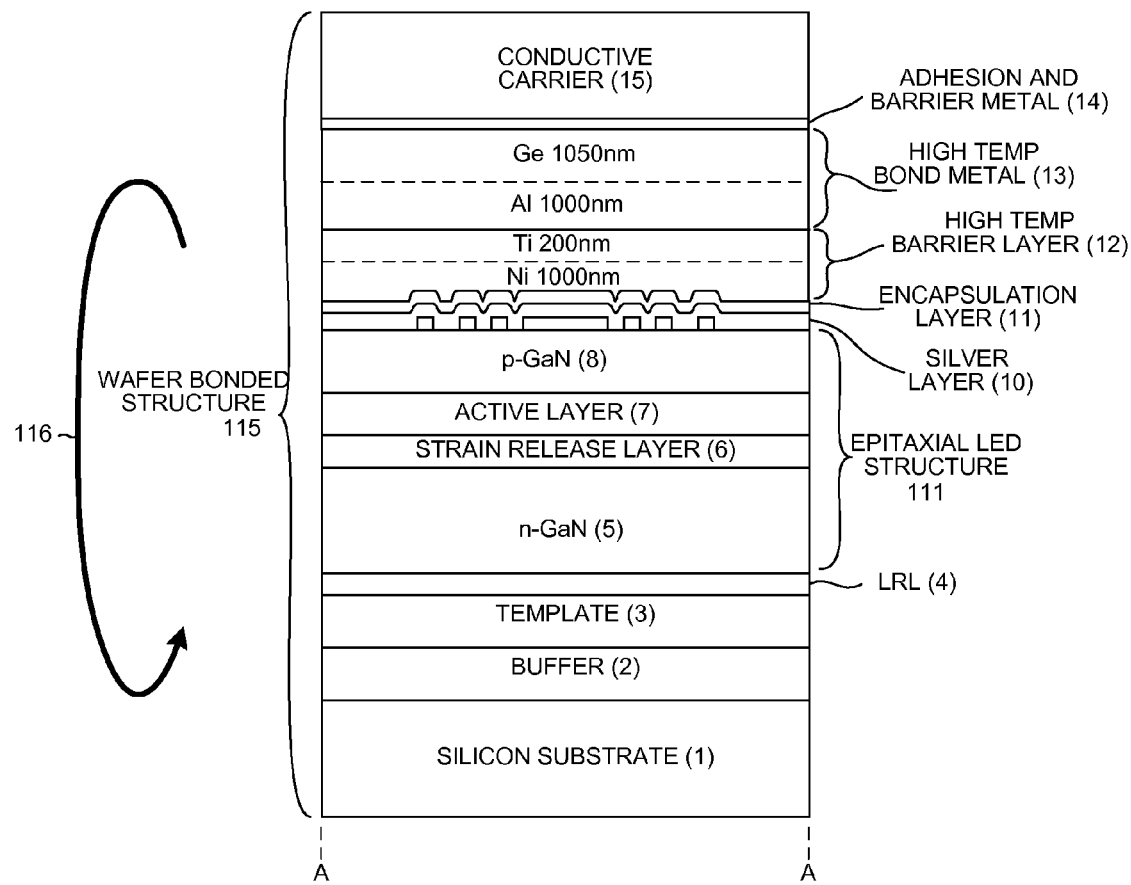

FIG. 11 shows a subsequent step in the method of manufacture. The resulting wafer bonded structure 115 is flipped as indicated by arrow 116.

Figure 12:
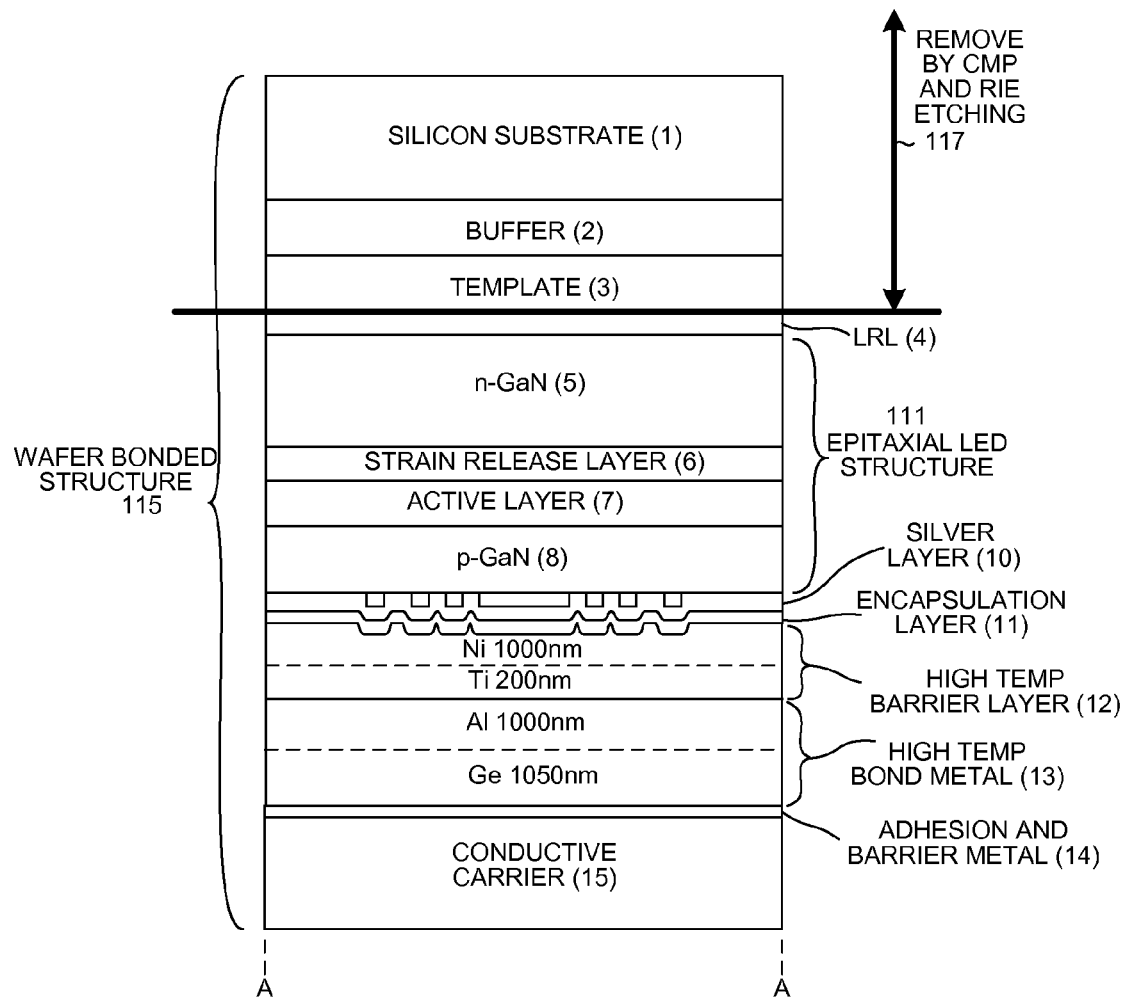

FIG. 12 shows a subsequent step in the method of manufacture. The silicon substrate 1, the buffer layer 2 and the template layer 3 are removed from wafer bonded structure 115 as indicated by arrow 117. In the present example, these layers are removed using grinding, lapping, Chemical Mechanical Polishing (CMP) and Reactive Ion Etching (RIE) techniques such that one of the GaN sublayers of LRL 4 is present and exposed at the top of the structure. Wet etching is then performed to etch horizontal and vertical streets down to the encapsulation layer 11, thereby forming a two-dimensional array of rows and columns of LED mesa structures. Each LED mesa structure includes the epitaxial LED structure of a different LED device.

Figure 13:
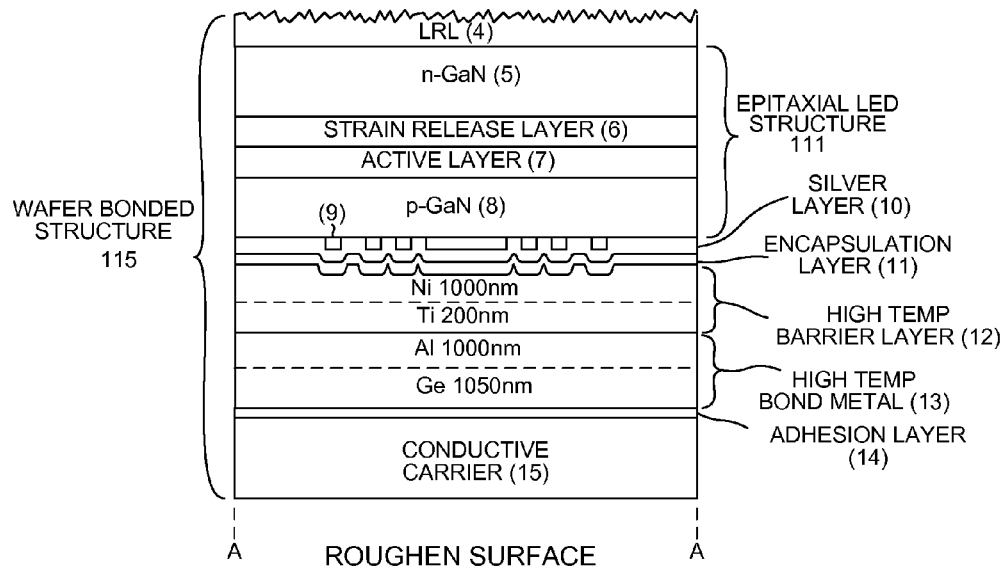

FIG. 13 shows a subsequent step in the method of manufacture. The upper surface of the exposed LRL 4 at the top of each LED mesa is roughened. This roughening is the type of roughening customarily performed to facilitate the escape of light from the LED device.

Figure 14:
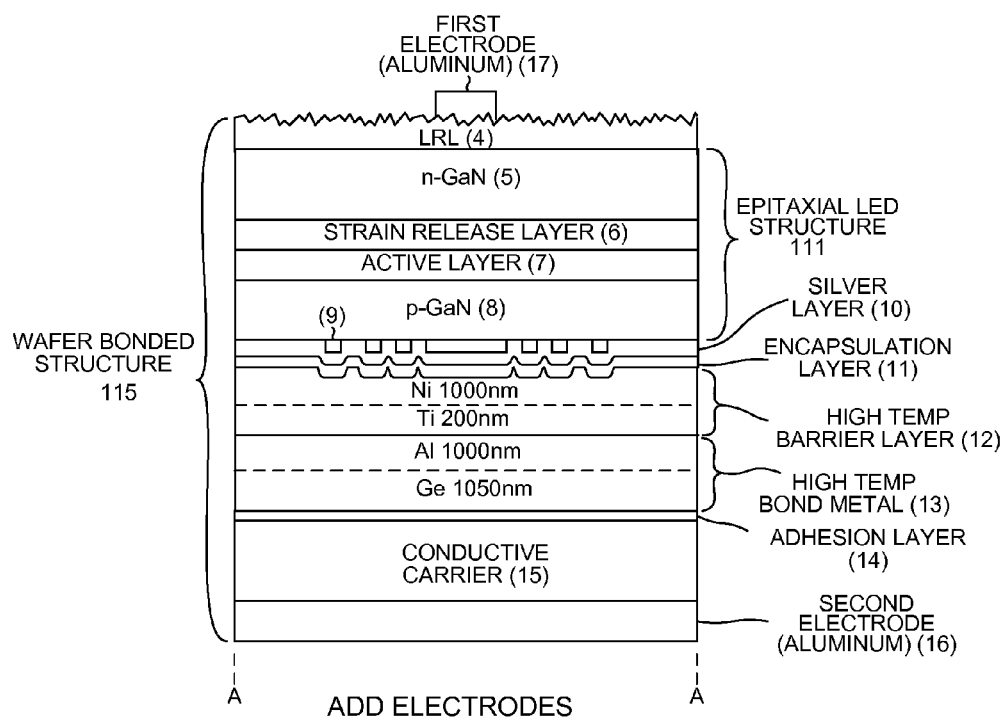

FIG. 14 shows a subsequent step in the method of manufacture. The second electrode 16 is formed on the conductive carrier 15 as illustrated. In the illustrated example, the second electrode 16 is a 220 nm thick layer of substantially pure aluminum. The second electrode includes no gold. In addition, the first electrode 17 is formed on the roughened upper surface of LRL 4 as illustrated. In the illustrated example, first electrode 17 is a 340 nm thick layer of substantially pure aluminum. The first electrode 17 includes no gold.

After the first and second electrodes have been added as shown in FIG. 14, the wafer bonded structure is singulated into separate blue LED devices. Singulation is performed by sawing the wafer bonded structure 115 down the streets that were formed by etching as described above. In the illustrated example, one of the resulting blue LED devices 104 is then incorporated into the white LED assembly 100 of FIG. 6.

Figure 15:
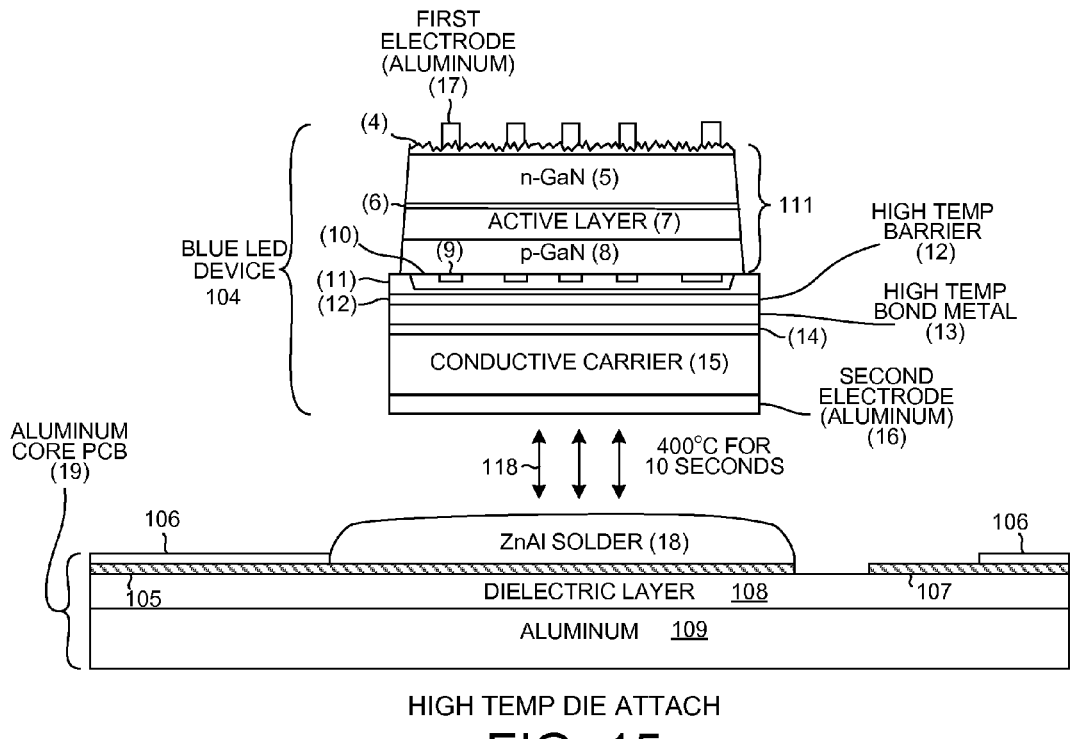

FIG. 15 shows a subsequent high temperature die attach step in the method of manufacture. In a first step, ZnAl solder paste is applied and is reflow heated so that the solder sticks to selected portions of the exposed metal on the upper surface of aluminum core PCB 19. The first metal portion 105 and the second metal portion 107 in FIG. 15 are, for example, aluminum or silver layers. The result is an amount of ZnAl solder that is pre-wetting the first metal portion 105 as illustrated in FIG. 15. The aluminum core PCB 19 is allowed to cool.

Next, the blue LED device 104 is placed on the pre-wetted aluminum core PCB 19 as indicated by arrows 118 and the combined structure is heated in a reflow oven to a temperature of about 400° C. for about ten seconds in what is referred to here as a high temperature die attach process. The ZnAl melts at about 380° C., but the extra 20° C. is provided for margin. The amount of ZnAl solder 18 melts, and bonds to the aluminum of the second electrode 16 on the bottom of the blue LED device 104.

Figure 16:
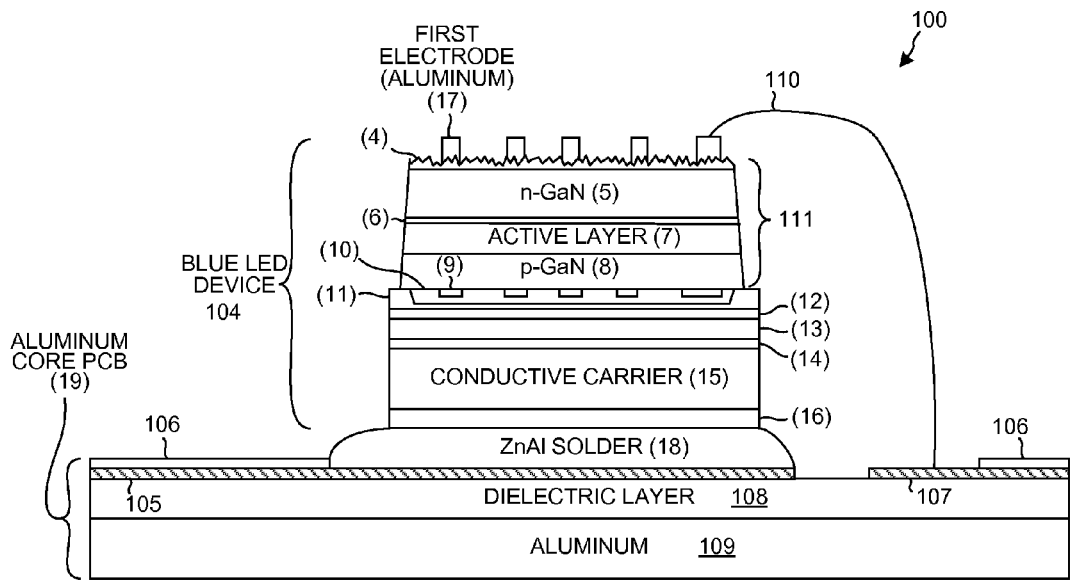

FIG. 16 shows the resulting structure of the blue LED device 104 soldered down to the aluminum core PCB 19.

Next, a pad of first electrode 17 is attached by the wire bond 110 to the second portion 107 of metal on the surface of aluminum core PCB 19.

After wirebonding, the retaining ring 20 (see FIGS. 4-6) of silicone is formed on the structure by silk screening. Alternatively, the retaining ring 20 is cut and shaped to the right dimensions, and then applied. Ring 20 is 0.5 mm to 3.0 mm high, and 0.2 mm to 1.5 mm wide. After the silicone has cured, the amount of phosphor 21 is dropped onto the blue LED device 104 so that it is retained by ring 20. The phosphor 21 is allowed to cure to form the completed white LED assembly 100.

Figure 17:
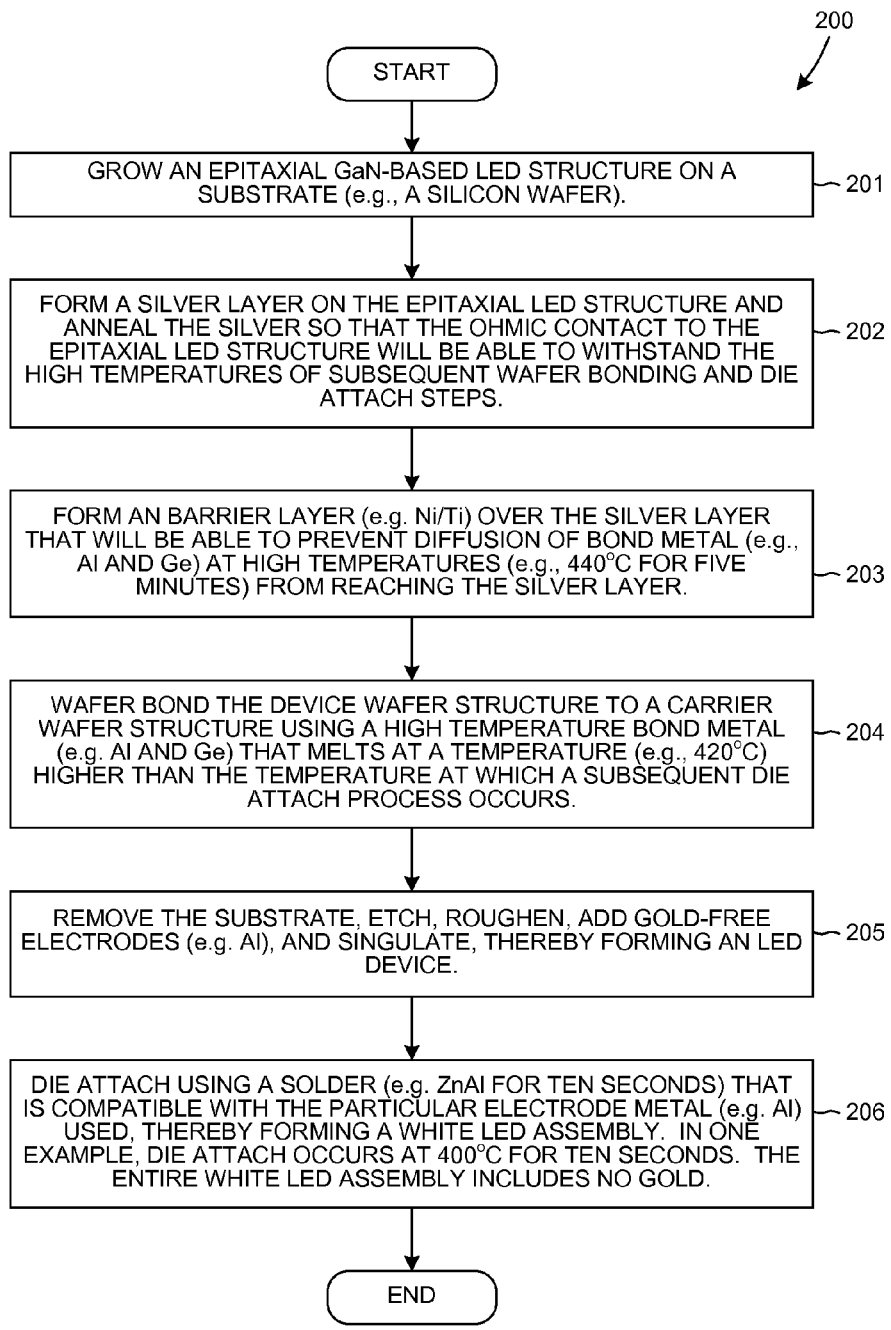
FIG. 17 is a flowchart of a method 200 in accordance with one novel aspect.

FIG. 17 is a flowchart of a method 200 in accordance with one novel aspect. An epitaxial LED structure is grown (step 201) on a substrate. In one example, the substrate is a silicon wafer. The epitaxial LED structure includes an n-type layer, a p-type layer, and an active layer disposed between the n-type layer and the p-type layer. The active layer comprises an amount of indium. A silver mirror layer is formed (step 202) on the p-type layer, thereby providing a highly reflective surface and also providing an ohmic contact to the epitaxial LED structure. The silver layer is annealed so that the silver to p-GaN interface will be able to withstand the high temperatures of a subsequent wafer bonding step and a subsequent die attach step. In one example, the silver is annealed at >400° C.

After an encapsulation layer is added, a barrier layer is formed (step 203) over the encapsulation layer. The barrier layer is able to prevent diffusion of bond metal (for example, aluminum and germanium) at high temperatures (for example, 440° C. for five minutes) from penetrating the barrier layer and reaching the silver layer. In one example, the barrier layer includes a 1000 nm thick sublayer of nickel, and a 200 nm thick sublayer of titanium. The silicon wafer with the epitaxial LED structure, the silver layer, the encapsulation layer, and the barrier layer is referred to here as a device wafer structure.

The device wafer structure is then wafer bonded (step 204) to a carrier device wafer using a high temperature bond metal. The high temperature bond metal melts at a temperature higher than the temperature of a subsequent die attach process. The result of the wafer bonding step is a wafer bonded structure. The original substrate is removed, streets are etched to form LED mesas, the tops of the LED mesas are roughened, first and second gold-free electrodes are added, and the wafer bonded structure is singulated (step 205), thereby forming an LED device.

The LED device is then die attached (step 206) in a soldering step to fix the second gold-free electrode of the LED device to a metal surface of a package or PCB. The solder used is a solder compatible with the particular electrode metal used. In one example, the electrode metal is aluminum, the solder is ZnAl, and the die attach soldering process occurs at a temperature greater than 380° C. (for example, 400° C.) for ten seconds. The high temperature of the die attach process is not high enough to melt the wafer bond metal layer.

After die attach, the first gold-free electrode of the LED device is wirebonded to the package or PCB. The result is a white LED assembly. In one example, the entire white LED assembly includes no gold. In one example, step 201 occurs at a first semiconductor fabrication facility operated by a first commercial entity, steps 202-205 occur at a second semiconductor fabrication facility operated by a second commercial entity. Step 206 may, for example, be performed by the first commercial entity at the first semiconductor fabrication facility, or at another facility.

Although certain specific embodiments are described above for instructional purposes, the teachings of this patent document have general applicability and are not limited to the specific embodiments described above. The high temperature wafer bonding process disclosed is not limited to use in making vertical LED devices, but rather also is usable in making laterally-contacted LED devices. Although an example is illustrated in which the solder of the die attach for a layer of solder that coats the entire bottom surface of the LED device, in other examples the solder is present in the form of an array of bond balls that attaches to a corresponding array of aluminum landing pads on the metal 105 of the aluminum core PCB 19. The carrier of the carrier wafer structure can be a non-conductive carrier in some examples. Although examples are set forth above where the epitaxial LED structure is grown on a silicon substrate, the epitaxial LED structure in other embodiments is grown on another type of substrate (for example, a sapphire substrate). Although examples are set forth above involving LEDs that include indium in their active layers, the high temperature wafer bonding and soldering disclosed above is also usable in the manufacture of other types of LEDs and other wafer bonded products. Accordingly, various modifications, adaptations, and combinations of various features of the described embodiments can be practiced without departing from the scope of the invention as set forth in the claims.

What is claimed is:

1. A method of manufacture comprising:
   (a) wafer bonding a carrier wafer structure to a device wafer structure by melting a bond metal disposed between the carrier wafer structure and the device wafer structure, wherein the device wafer structure comprises a silicon substrate and an epitaxial Light Emitting Diode (LED) structure formed on the silicon substrate, wherein the epitaxial LED structure comprises an n-type layer, a p-type layer, and an active layer disposed between the n-type layer and the p-type layer, wherein the active layer comprises an amount of indium, wherein the carrier wafer structure comprises a carrier, wherein the bond metal layer includes substantially no gold and wherein the wafer bonding of (a) results in a wafer bonded structure;
   (b) after (a) removing the silicon substrate from the wafer bonded structure;
   (c) after (b) forming first and second electrodes, the first electrode being in contact with the n-type layer, the second electrode being in contact with the p-type layer; and
   (d) singulating the wafer bonded structure thereby forming an LED device,
   wherein the bond metal comprises aluminum and silicon.

2. The method of manufacture of claim 1, wherein the carrier is a silicon wafer.

3. The method of manufacture of claim 1, further comprising:
   (e) prior to (a) providing a silver layer over the epitaxial LED structure of the device wafer structure; and
   (f) after (e) and prior to (a) providing a barrier layer over the silver layer, wherein the barrier layer comprises an amount of nickel.

4. The method of manufacture of claim 1, further comprising:
   (e) prior to (a) providing a silver layer over the epitaxial LED structure of the device wafer structure; and
   (f) after (e) and prior to (a) annealing the silver layer onto the epitaxial LED structure at a temperature of at least approximately 400 degrees Celsius.

5. The method of manufacture of claim 1, wherein the LED device comprises substantially no gold.

6. The method of manufacture of claim 1, wherein the bond metal has a melting temperature, the method further comprising:
   (e) soldering the LED device to a metal surface by melting an amount of solder between the LED device and the metal surface, wherein the solder has a melting temperature that is lower than the melting temperature of the bond metal.

7. The method of manufacture of claim 6, wherein the soldering of (e) results in an LED assembly, and wherein the LED assembly comprises substantially no gold.

8. The method of manufacture of claim 6, wherein the metal surface is a surface of a metal core Printed Circuit Board.

9. The method of manufacture of claim 1, wherein the wafer bonding of (a) is carried at a temperature of at least approximately 380 degrees Celsius.

10. A method of manufacture comprising:
    (a) wafer bonding a carrier wafer structure to a device wafer structure by melting a bond metal disposed between the carrier wafer structure and the device wafer structure, wherein the device wafer structure comprises an epitaxial Light Emitting Diode (LED) structure, wherein the epitaxial LED structure comprises an n-type layer, a p-type layer, and an active layer disposed between the n-type layer and the p-type layer, wherein the active layer comprises an amount of indium, wherein the carrier wafer structure comprises a carrier, and wherein the bond metal comprises aluminum and germanium.

11. The method of manufacture of claim 10, wherein the device wafer structure includes a silicon substrate, and wherein the wafer bonding of (a) results in a wafer bonded structure, the method further comprising:
    (b) after (a) removing the silicon substrate from the wafer bonded structure;
    (c) after (b) forming first and second electrodes, the first electrode being in contact with the n-type layer, the second electrode being in contact with the p-type layer; and
    (d) singulating the wafer bonded structure thereby forming an LED device.

12. A method of manufacture comprising:
    (a) wafer bonding a carrier wafer structure to a device wafer structure by melting a bond metal disposed between the carrier wafer structure and the device wafer structure, wherein the device wafer structure comprises a silicon substrate and an epitaxial Light Emitting Diode (LED) structure formed on the silicon substrate, wherein the epitaxial LED structure comprises an n-type layer, a p-type layer, and an active layer disposed between the n-type layer and the p-type layer, wherein the active layer comprises an amount of indium, wherein the carrier wafer structure comprises a carrier, wherein the bond metal layer includes substantially no gold and wherein the wafer bonding of (a) results in a wafer bonded structure;
    (b) after (a) removing the silicon substrate from the wafer bonded structure;
    (c) after (b) forming first and second electrodes, the first electrode being in contact with the n-type layer, the second electrode being in contact with the p-type layer; and
    (d) singulating the wafer bonded structure thereby forming an LED device,
    wherein the bond metal comprises an aluminum sublayer and a germanium sublayer, wherein the aluminum sublayer at the time of the wafer bonding of (a) is a part of the device wafer structure, wherein the germanium sublayer at the time of the wafer bonding of (a) is a part of the carrier wafer structure, and wherein the aluminum sublayer and the germanium sublayer fuse together during the wafer bonding of (a).

13. The method of manufacture of claim 12, wherein the carrier is a silicon wafer.

14. The method of manufacture of claim 12, further comprising:
(e) prior to (a) providing a silver layer over the epitaxial LED structure of the device wafer structure; and
(f) after (e) and prior to (a) providing a barrier layer over the silver layer, wherein the barrier layer comprises an amount of nickel.

15. The method of manufacture of claim 12, further comprising:
(e) prior to (a) providing a silver layer over the epitaxial LED structure of the device wafer structure; and
(f) after (e) and prior to (a) annealing the silver layer onto the epitaxial LED structure at a temperature of at least approximately 400 degrees Celsius.

16. The method of manufacture of claim 12, wherein the LED device comprises substantially no gold.

17. The method of manufacture of claim 12, wherein the bond metal has a melting temperature, the method further comprising:
(e) soldering the LED device to a metal surface by melting an amount of solder between the LED device and the metal surface, wherein the solder has a melting temperature that is lower than the melting temperature of the bond metal.

18. The method of manufacture of claim 17, wherein the soldering of (e) results in an LED assembly, and wherein the LED assembly comprises substantially no gold.

19. The method of manufacture of claim 12, wherein the wafer bonding of (a) is carried at a temperature of at least approximately 380 degrees Celsius.

20. A method of manufacture comprising:
(a) wafer bonding a carrier wafer structure to a device wafer structure by melting a bond metal disposed between the carrier wafer structure and the device wafer structure, wherein the device wafer structure comprises a silicon substrate and an epitaxial Light Emitting Diode (LED) structure formed on the silicon substrate, wherein the epitaxial LED structure comprises an n-type layer, a p-type layer, and an active layer disposed between the n-type layer and the p-type layer, wherein the active layer comprises an amount of indium, wherein the carrier wafer structure comprises a carrier, wherein the bond metal layer includes substantially no gold, and wherein the wafer bonding of (a) results in a wafer bonded structure;
(b) after (a) removing the silicon substrate from the wafer bonded structure;
(c) after (b) forming first and second electrodes, the first electrode being in contact with the n-type layer, the second electrode being in contact with the p-type layer;
(d) singulating the wafer bonded structure thereby forming an LED device;
(e) attaching the LED device to a metal surface by melting an amount of solder, wherein the solder has a melting temperature, wherein the melting temperature of the solder is lower than a melting temperature of the bond metal,
wherein the bond metal comprises aluminum and germanium.

21. The method of manufacture of claim 20, wherein the solder comprises zinc and aluminum.

22. The method of manufacture of claim 20, wherein the LED device further comprises a barrier layer and a silver layer, wherein the barrier layer is disposed between the bond metal and the silver layer, and wherein the barrier layer comprises an amount of nickel.

23. The method of manufacture of claim 20, wherein the melting temperature of the bond metal is at least approximately 380 degrees Celsius.

24. The method of manufacture of claim 20, wherein the metal surface is a surface of a metal core Printed Circuit Board.

25. The method of manufacture of claim 20, wherein the LED device comprises substantially no gold.

* * * * *